(12) United States Patent
Op de Beeck

(10) Patent No.: US 7,824,827 B2
(45) Date of Patent: Nov. 2, 2010

(54) METHOD AND SYSTEM FOR IMPROVED LITHOGRAPHIC PROCESSING

(76) Inventor: Maria Op de Beeck, Sint-Jorislaan 9, 3001 Heverlee (BE)

(*) Notice: Subject to any disclaimer, the term of this patent is extended or adjusted under 35 U.S.C. 154(b) by 891 days.

(21) Appl. No.: 11/224,367

(22) Filed: Sep. 12, 2005

(65) Prior Publication Data
US 2007/0059615 A1    Mar. 15, 2007

(51) Int. Cl.
*G03C 5/00* (2006.01)
*G03F 3/00* (2006.01)
*H01L 21/00* (2006.01)
*G01R 31/26* (2006.01)

(52) U.S. Cl. .............. 430/30; 430/5; 430/311; 438/14

(58) Field of Classification Search ............ 430/30, 430/311
See application file for complete search history.

(56) References Cited

U.S. PATENT DOCUMENTS

| | | | |
|---|---|---|---|
| 6,373,553 B1* | 4/2002 | Singh | 355/55 |
| 2002/0097493 A1 | 7/2002 | Li | |
| 2004/0165271 A1 | 8/2004 | Krautschik | |
| 2005/0153540 A1 | 7/2005 | Mimotogi | |
| 2006/0236294 A1 | 10/2006 | Saidin et al. | |
| 2007/0015082 A1* | 1/2007 | Angelopoulos et al. | 430/270.1 |
| 2007/0059847 A1 | 3/2007 | Op de Beeck | |
| 2007/0059849 A1 | 3/2007 | Op de Beeck | |

FOREIGN PATENT DOCUMENTS

EP        1016930        7/2000

OTHER PUBLICATIONS

Mack, Chris, "The Lithography Expert: Designing a Bottom Antireflective Coating", Microlithography World, dated Feb. 2005.

* cited by examiner

*Primary Examiner*—Mark F Huff
*Assistant Examiner*—Jonathan Jelsma
(74) *Attorney, Agent, or Firm*—McDonnell Boehnen Hulbert & Berghoff LLP

(57) ABSTRACT

A method is described for setting up the lithographic processing of a substrate. The lithographic processing typically is characterized by a set of selectable process parameters, such as the thickness, real refractive index, and absorption coefficient of a bottom anti-reflective layer. The method includes selecting a set of values for the selectable process parameters, determining the substrate reflectivity in the resist layer for these parameters, and evaluating if the determined substrate reflectivity is smaller than a maximum allowable substrate reflectivity in the resist layer. The maximum allowable substrate reflectivity is determined according to a floating criterion, i.e., the maximum allowable substrate reflectivity depends on a Normalized Image Log Slope related parameter.

11 Claims, 10 Drawing Sheets

METHOD AND SYSTEM FOR IMPROVED LITHOGRAPHIC PROCESSING

FIELD

The present invention relates to the field of lithography especially as applied to semiconductor processing. More particularly, the present invention relates to methods and devices for improved optical lithographic processing of devices.

BACKGROUND

In the production of today's integrated circuits, optical lithography is one of the key techniques. A well-known problem in optical lithography, related to the transparency of state-of-the-art resists, is the occurrence of unwanted multiple interference effects in the resist layer during illumination, caused by a relatively high substrate reflection. Light, which propagated through the resist, is partially reflected back into the resist by the substrate on which this resist has been deposited. The substrate itself can comprise a stack of various layers (e.g., a stack of dielectric layers or conductive layers formed on a semiconductor substrate).

Multiple interference effects result in a variation of illumination intensity with resist depth, causing a variation of the development rate with resist depth. As a result, the resist walls have a scalloped profile, or so-called 'standing waves.' In extremes, this standing wave problem will cause pattern collapse of lines in defocus, e.g., strongly pronounced standing waves at the bottom of the resist layer and/or incomplete development of lines or contact holes, especially in defocus.

The multiple interference effects in the resist will result in a variation of total absorbed energy with resist thickness, hence, in a variation of the critical dimension (CD) with resist thickness. The latter is known as the 'swing effect,' which will cause CD non-uniformity if patterns have to be made on substrates with topography.

These multiple interference effects in the resist and, hence, the total amount of energy absorbed will also depend on the layers underneath the resist and variations thereof in thickness and/or composition. For example, the interference effects will be different if a contact hole is to be printed in a resist layer on top of an oxide or on top of a nitride layer, as both dielectric layers have different optical properties, such as transparency.

Typically, bottom anti-reflective coatings (BARC), also referred to as bottom anti-reflective layers (BARL), are used in between the resist and the substrate to decrease the occurrence of multiple interference effects due to reflection by the substrate. Using such layers, the reduction in substrate reflectivity can take place in two ways: (1) by absorption of light in the BARC or (2) by destructive interference of light rays at the bottom of the resist. Often the use of a BARC is crucial to control the reflection caused by the substrate.

Conventionally, BARC thickness optimization is carried out by calculating the substrate reflectivity versus BARC thickness for light rays perpendicularly incident on the wafer. Such calculations typically can be performed by state-of-the-art lithography simulation programs or tools calculating basic optics. Typically, the substrate reflectivity will drop with BARC thickness due to absorption, but local minima and maxima in the substrate reflectivity curve as function of the BARC thickness are present due to interference effects. The first minimum of this curve that provides sufficiently low substrate reflectivity is considered to be the optimum BARC thickness.

In order to evaluate whether the lithographic process will lead to sufficient print quality, typically in conventional lithographic processes, the substrate reflectivity is considered sufficiently low when it is below 0.5%. BARC layers thus will be considered appropriate if the resulting substrate reflectivity is below this fixed, pre-determined value.

SUMMARY

Improved systems and methods for setting up lithographic processing of a substrate, as well as apparatus and methods for performing such lithographic processing, is described. The systems and methods have the advantage that they allow lithographic processing resulting in a high quality print.

A method for setting up lithographic processing of a substrate with a resist layer is described. The lithographic processing is characterized by a set of selectable process parameter values. The method includes selecting values for a set of process parameters, determining the substrate reflectivity in the resist layer for the lithographic processing characterized by the set of selected process parameter values, and evaluating whether the determined substrate reflectivity is smaller than a maximum allowable substrate reflectivity. The maximum allowable substrate reflectivity is determined as a function of a normalized image log-slope for the lithographic processing. The resist can be a positive or negative resist.

The evaluating may include accepting the set of selected process parameter values if the substrate reflectivity is equal to or smaller than a maximum allowable substrate reflectivity and/or rejecting the set of selected process parameter values if the substrate reflectivity is larger than a maximum allowable substrate reflectivity. After rejecting, the method may include repeating the steps of selecting, determining, and evaluating.

The evaluating also may comprise, if the substrate reflectivity is equal to or smaller than a maximum allowable substrate reflectivity, ranking the lithographic processing determined by the set of selected process parameter values. The ranking may be performed as a function of the determined substrate reflectivity.

The lithographic processing may comprise using at least one bottom anti-reflective layer for reducing substrate reflectivity for incident light rays, the at least one bottom anti-reflective layer being characterized by a set of selectable optical parameter values. The selecting a set of process parameter values includes selecting a set of optical parameter values for the at least one bottom anti-reflective layer.

Setting up the lithographic processing may include selecting the substrate material properties. The substrate material properties may be composition and thickness of the substrate material.

The optical parameter values may be any of or a combination of the thickness of the at least one bottom anti-reflective layer, the real refractive index of the at least one bottom anti-reflective layer, or an absorption coefficient related parameter of the at least one bottom anti-reflective layer. The absorption coefficient related parameter may be the absorption coefficient or the extinction coefficient.

The at least one bottom anti-reflective layer may be sandwiched between the substrate and a resist layer, whereby the substrate reflectivity is determined based on the amount of light reflected from the substrate and the at least one bottom anti-reflective layer into the resist layer.

The maximum allowable substrate reflectivity may be proportional to the normalized image log-slope (NILS), wherein the proportionality factor is a constant determined by the selected resist process, the selected resist thickness, and/or the required CD control.

The maximum allowable substrate reflectivity may be smaller than 0.5%, preferably smaller than 0.3%, more preferably smaller than 0.1%.

The method may further include identifying different structures to be processed and determining the corresponding NILS, determining the maximum allowable substrate reflectivity for the different NILS values, and selecting at least one structure corresponding with the lowest value(s) for the ratio NILS/maximum allowable substrate reflectivity in combination with performing the selecting values of the process parameters, the determining the substrate reflectivity, and the evaluation step for optimizing lithographic processing of the at least one selected structure.

The substrate reflectivity may be determined taking into account the angle of incidence of incident light rays on the substrate and/or the at least one bottom anti-reflective layer. Furthermore, also the amplitude of the light rays and the polarization state of the light rays may be taken into account. These parameters will determine the NILS value and the substrate reflectivity.

The set of selectable parameters of the lithographic processing may include any of or a combination of the applied numerical aperture, the coherency factor, the mask type, the mask pattern and mask pitch and the real refractive index, extinction coefficient and thickness of any or a combination of an immersion fluid used in the lithographic processing, a coating on top of a resist layer used in the lithographic processing, a resist layer used in the lithographic processing or substrate material properties.

A method for selecting at least one bottom anti-reflective coating for lithographic processing of a device is also described. The method includes selecting values for optical parameters characterizing the at least one bottom anti-reflective coating so as to obtain a substrate reflectivity smaller than a maximum allowable substrate reflectivity. The maximum allowable substrate reflectivity is determined as a function of a normalized image log-slope for the lithographic processing.

A method for lithographic processing of a device is also described. The lithographic processing includes using at least one bottom anti-reflective coating. The at least one bottom anti-reflective coating is selected according to a method including selecting values for optical parameters characterizing the at least one bottom anti-reflective coating so as to obtain a substrate reflectivity smaller than a maximum allowable substrate reflectivity. The maximum allowable substrate reflectivity is determined as a function of a normalized image log-slope for the lithographic processing.

A computer program product for executing a method is also described. The method is for setting up lithographic processing of a substrate with a resist layer. The lithographic processing is characterized by a set of selectable process parameter values. The method includes selecting values for a set of process parameters, determining the substrate reflectivity in the resist layer for the lithographic processing characterized by the set of selected process parameter values, and evaluating whether the determined substrate reflectivity is smaller than a maximum allowable substrate reflectivity. The maximum allowable substrate reflectivity is determined as a function of a normalized image log-slope for the lithographic processing.

A machine readable data storage device for storing the computer program product as described above and the transmission of such a computer program product over a local or wide area telecommunications network is also described.

The systems and methods described herein have the advantage that, for critical lithographic processes, they allow reduction of the critical dimension swing, pattern collapse or incomplete development in lithographic processes.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

As used herein, substrate reflectivity means the amount of light reflected back into the resist layer, including the light reflected by any of the layers underlying the resist layer or the stack of resist layers.

Figure 1:
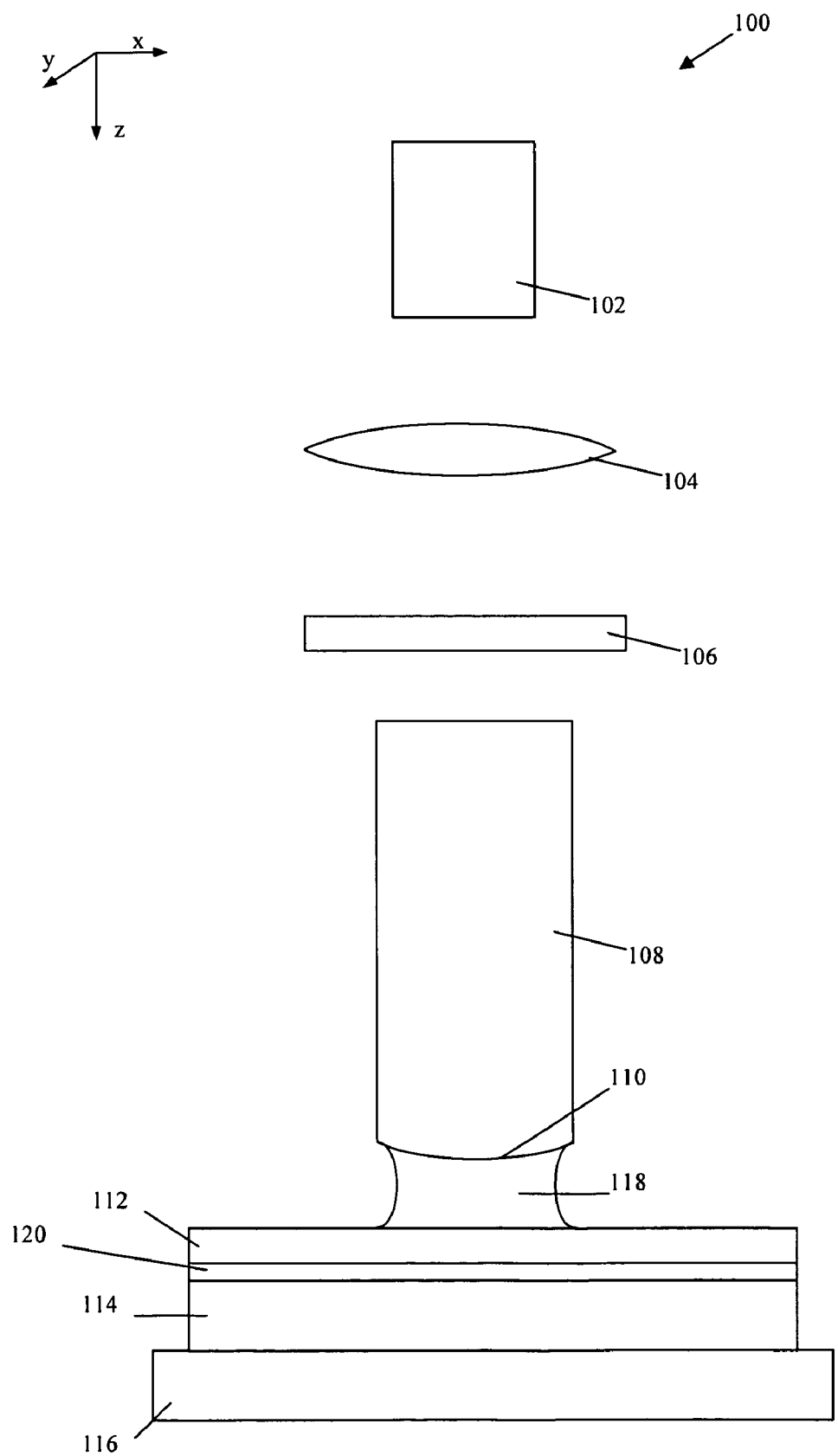
FIG. 1 is a block diagram of a lithographic system, according to an example.

In a first example, a method for setting up lithographic processing of a substrate is described. The method is especially suitable for setting up lithographic processing of a substrate in which high numerical aperture (NA) lithography is used. The method is applicable to lithographic processing, which can be performed on any type of lithographic set-up, such as but not limited to the set-up shown in FIG. 1. An optical lithographic system with a transmission set-up is shown, although the invention is not limited thereto and, for example, is also applicable to a system with a reflection set-up. It may be, for example, a lithographic stepper system or a lithographic scanner system.

The optical lithographic system 100 typically comprises a source of electromagnetic radiation, such as a light source 102. The light from the light source 102 typically is transmitted through an optical system 104 including a diffracting optical element, such as a lens or grating, and is incident on a mask 106. The mask 106 contains information about the image to be generated in a resist layer and is basically defined thereby.

Typically the mask 106 may be part of a set of masks used for creating a device or a circuit using lithography. Different types of masks exist; such as an alternated phase shift mask, an attenuated phase shift mask, a binary mask, and so on. The light, carrying the mask information, is passed through an imaging module 108, which may have a final lens surface 110, and thus is guided to a resist layer 112 on a substrate 114. The optics of the imaging module 108 inherently defines the numerical aperture (NA) of the imaging module 108. It is well known by a person skilled in the art that the wider the numerical aperture, the more light (e.g., diffracted by the mask 106) can be collected.

The substrate 114 typically is mounted on a substrate stage 116. Optionally, in case of immersion lithography, typically an immersion fluid 118 is provided between the resist layer 112 and the output of the imaging module 108, e.g., the final lens surface 110, in order to allow increase of the numerical aperture of the system 100. In order to reduce substrate reflection, typically at least one bottom anti-reflective coating (BARC) 120, also referred to as bottom anti-reflective layer (BARL), may be provided between the resist layer 112 and the substrate 114. It is to be noticed that such optical lithographic systems 100 are well known by a person skilled in the art, including optional and/or additional components not illustrated in FIG. 1.

The method is related to selecting process parameters such that an allowed amount of substrate reflectivity in the resist layer is obtained. Surprisingly, it has been found that the maximum amount of allowable substrate reflectivity (i.e., the substrate reflectivity that is allowable while not restricting the quality of the obtained lithographic process too much) is not constant, as the 0.5% limit typically chosen in the prior art, but that it rather is a function of a normalized image log-slope (NILS) related parameter.

As used herein, "not restricting the quality of the obtained device structure too much" or "not restricting the quality of the corresponding lithographic process too much" means that the amount of swing for the critical dimension is low, and that the operational window for the exposure latitude and the depth of focus is sufficiently large. Typically, the total variation in the critical dimension due to all process variations and non-uniformities should be less than ±10%, the exact value being dependent on the application as appreciated by a person skilled in the art. The substrate reflectivity should only account for a minor portion of this overall variation, typically one third thereof or less.

The normalized image log-slope (NILS) related parameter may be the normalized image log-slope (NILS) parameter itself or may be any related parameter which also is an image metric, providing information about the feature's exposure latitude. Typically, the NILS parameter may be defined as the slope of the natural logarithm of the intensity plot (i.e., the so-called aerial image whereby the image of the photomask is projected onto the plane of the substrate assuming air is present instead of resist). The NILS may be given by the mathematical expression:

$$NILS = L\frac{\partial(\ln I)}{\partial x}$$

with L being the linewidth, I being the image intensity and x being a position parameter.

Such NILS typically is measured at the desired photoresist edge position and normalized by multiplying with the nominal resist feature width. Hence, the value of the NILS parameter is a property of the structure for which this parameter is defined and can vary from one structure to another depending on, among other things, the dimensions and the layout of the structure. Generally, the sign of the slope is adjusted so as to be positive when the image is sloping in the correct direction.

According to the present example, no absolute criterion for substrate reflectivity but a floating criterion for the substrate reflectivity is obtained. This method has the advantage of allowing setting up of an appropriate lithographic processing of a device, whereby the lithographic processing is of high quality. For example, disadvantageous effects due to inappropriate illumination of the resist layer used in the lithographic processing are controlled and possibly minimized by using a floating criterion for the substrate reflectivity.

Figure 2:
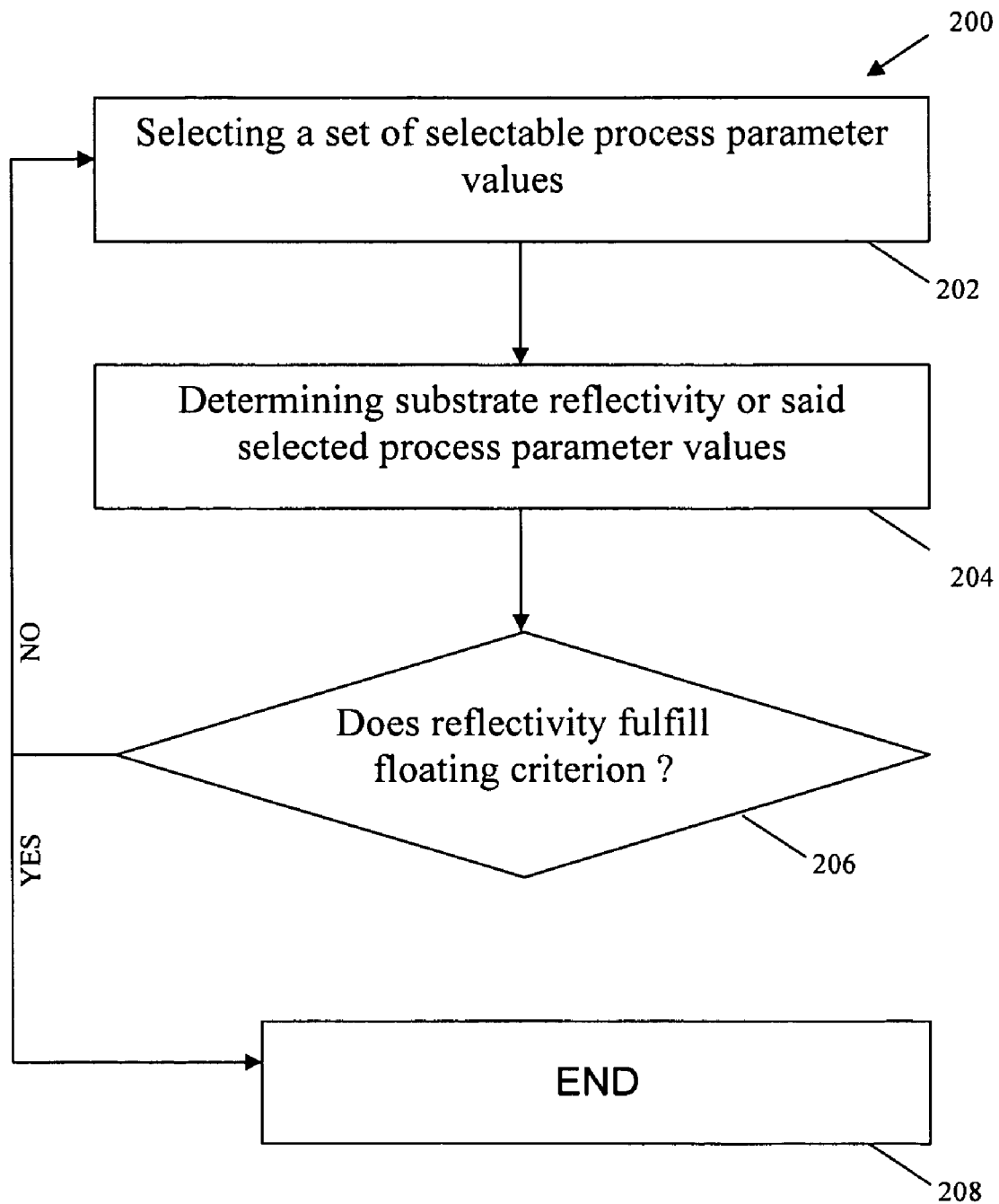
FIG. 2 is a flow chart of a method for setting up lithographic processing of a substrate, according to an example.

The method according to the present example may comprise a number of different steps, shown by way of example in FIG. 2.

The method 200 for setting up lithographic processing of a substrate may include at block 202, selecting values for a set of selectable process parameters, characterizing the lithographic processing, i.e., characterizing at least part of the lithographic process set-up that is used. Such selectable parameters may be BARC related parameters, such as the thickness, real refractive index, and absorption coefficient of at least one bottom anti-reflective coating. Other parameters for performing the lithographic processing are determined by the lithographical setup available and/or the lithographic process to be performed.

Alternatively or additionally, other than BARC related parameters may be selectable, such as any of or a combination of the applied numerical aperture, the coherency factor, the mask type, the mask pattern and mask pitch and the real refractive index, extinction coefficient and thickness of any or a combination of an immersion fluid used in the lithographic processing, a coating on top of a resist layer used in the lithographic processing, a resist layer used in the lithographic processing or substrate material parameters, such as, if a dielectric is used, the type of dielectric and or the thickness of such a dielectric. Such parameters are typically influenced by the lithographic system, i.e., determined by or selected for the lithographic system, and influenced by the mask used for the lithographic processing. This selecting may be done automatically by selecting the parameter values of a known lithographic processing method or system (e.g., in order to test whether a system fulfils the quality requirements) or it may be done by actually selecting values for the process parameters (e.g., in order to find the optimum parameters for the lithographic process).

At block 204, the substrate reflectivity r is determined for the lithographic processing characterized by the set of selected values for the process parameters. Determining the substrate reflectivity may be done either experimentally by assessment of the resulting quality of the print or theoretically. The substrate reflectivity may be determined based on typical simulation programs, such as Solid-c version 6.5.0.1 from Sigma c, but is not limited thereto.

As used herein, substrate reflectivity refers to the amount of light reflected back in the resist layer due to reflection by the substrate and/or, if present, the at least one bottom anti-reflective layer. If the substrate reflectivity is determined by calculation or simulation, the substrate reflectivity preferably is determined by incorporating the optical parameters of all components used in the lithographic processing. The substrate reflectivity may be determined based on simulation or calculation whereby perpendicular incident light rays are considered, or a more accurate calculation method may be used.

At block 206, it is decided whether the determined substrate reflectivity fulfills a criterion that is a function of the NILS or of a NILS related parameter. In other words, it is decided whether the determined substrate reflectivity fulfills a floating criterion, being that the maximum allowable substrate reflectivity for a structure is not larger than a value depending on the NILS value or a parameter related thereto of that structure.

If the criterion is fulfilled, the set of selected parameter values is considered allowable. If the floating criterion is not met, the set of selected parameter values is not considered allowable. The method of setting up lithographic processing of a substrate furthermore may include, if the set of selected parameter values is not considered allowable, selecting a new set of parameter values and repeating the determining and evaluation steps. Such process may be repeated until a suitable or allowable set of process parameter values is obtained. Selection of parameter values may be done either systematic or at random. The method according to the present invention may be performed in an automated way, e.g., based on specific computer implemented algorithms, neural networks, etc.

The present example thus allows evaluation of the maximum allowable substrate reflectivity according to a floating criterion, which is a non-fixed criterion which is structure-dependent. The floating criterion for the maximum allowable substrate reflectivity may be expressed as max.allowable amount of substrate reflected light=$f$(NILS). [1]

The maximum allowable substrate reflectivity in the resist layer may be such that the maximum allowable substrate reflectivity is smaller for a small NILS, and larger for a large NILS. In other words, the maximum allowable substrate reflectivity may be a positive function of the NILS or a NILS related parameter following the same trend as the NILS. Further, in a first approximation, the maximum allowable substrate reflectivity may be expressed as being proportional to the NILS, i.e.

max.allowable amount of reflected light in resist=$c$.NILS [2]

with c being a constant, whereby the constant depends on various parameters such as resist process, resist thickness, the required critical dimension control, etc.

For lithographic processing with masks comprising different structures, which is often the case, the above method may include taking into account the different NILS values for different structures that are patterned. As for structures having a small NILS the corresponding maximum will be less than for structures having a larger NILS, only structures having a critical NILS value could be taken into account.

A possible, non-limiting way for taking into account different NILS values for different structures may be as follows. For a given mask, the different structures on the mask may be identified. For each of the identified structures, the NILS can be determined. For each of the determined NILS values, the maximum allowable substrate reflectivity may be determined. The latter could be obtained from a look up table, a known mathematical expression, such as equation [1] or equation [2], or predetermined information, based on experimental results. The latter results in a number of NILS/maximum allowable substrate reflectivity values.

After ranking these values, at least for the structures with the lowest value for the NILS/maximum allowable substrate reflectivity, the effective substrate reflectivity may be evaluated, for example, by performing method 200. The latter allows evaluation whether the selected lithographic system parameters are chosen correctly or whether another set of parameters needs to be selected and the procedure needs to be repeated.

The floating criterion may allow obtaining a sufficient quality of the lithographic print, resulting in less swing effects, a reduced collapsing of lines, a reduced incomplete development, a reduced variation in development rate of the resist, and so on.

The latter may be understood from the following illustrative non-limiting considerations. Critical dimension swing effects are caused by a variation in absorbed energy in the resist, which may be due to resist thickness variations or differences in substrate reflectivity.

The critical dimension control is determined by $\Delta CD = \Delta CD_{bulk} + \Delta CD_{swing}$, [3]

wherein $\Delta CD_{bulk}$ is the variation in critical dimension caused by the substrate and whereby the critical dimension of the swing is determined by $\Delta CD_{swing} \rightarrow \Delta Abs.Energy_{swing}/$Exposure latitude [4]

The exposure latitude is proportional to the Normalized Image Log Slope (NILS), i.e.

Exposure latitude~NILS [5]

This variation in absorbed energy is dependent on the substrate reflectivity, as indicated in formula [6], being the swing formula by T. A. Brunner, adjusted for non-oblique light rays, and given by $$\Delta Abs.Energy_{swing} \sim \pm 2 \exp\left(\frac{-\alpha D_r}{\cos\theta_r}\right) \cdot \sqrt{Substr.Refl. \times TopRefl.} \quad [6]$$

with $\alpha$ the absorption coefficient in the resist, $D_r$ the resist thickness and $\theta_r$ the angle of light in resist.

Because of this relationship, the substrate reflectivity should be sufficiently low in order to reduce the variations in absorbed energy, and hence to reduce the CD variations. But, as can be seen in the above formulas, not only the variations in absorbed energy are important, the exposure latitude and hence the NILS plays a very important role too as the NILS parameter is related to the exposure latitude. In case of a low exposure latitude (low NILS), absorbed energy variations will result in large CD swing effects, while the same energy variations are causing only minor CD swing effects if combined with a large exposure latitude (large NILS). Since not only the substrate reflectivity but also NILS is very important with respect to CD swing effects, the maximum allowable substrate reflectivity should not be a constant as is done in the prior art, but should be structure dependent, i.e. should be NILS dependent.

A second example relates to a method for setting up lithographic processing of a substrate, in which for the calculation of the substrate reflectivity, the angle of incidence of the incident light is taken into account. As used herein, the phrase "taking into account the angle of incidence of the incident light" means taking into account the angles of incidence for the light captured by the optical diffracting element such as the lens. Angles of incidence of at least the zero order diffraction and first order diffractions, but preferably of all higher order diffractions captured by the lens are taken into account. In other words, in the present example, determination of the substrate reflectivity is not done based on light that is incident perpendicularly to the resist layer, the substrate or, if present, the BARC layer, but the angles of incidence of the light onto the corresponding surfaces and/or interfaces are taken into account.

By determining the substrate reflectivity accordingly, other allowed process parameter values may be obtained, than the ones based on the conventional way of determining substrate reflectivity. The latter is caused by the fact that taking into account the angles of incidence of the light rays, the optical path length of the light rays may be taken into account. Whereas preferably all angles of incidence of the light rays are taken into account, an average angle of incidence could also be used. Besides taking into account the angles of incidence, alternatively or additionally, the difference in amplitude for light rays having a different angle of incidence may be taken into account and/or the difference in polarization state for light rays having a different angle of incidence may be taken into account.

In a further example, the method of the first and/or second examples may be used for selecting at least one BARC layer. Selecting at least one BARC layer includes at least one of selecting a thickness, a real refractive index and an absorption coefficient or a parameter related thereto such that the floating criterion for maximum allowable substrate reflectivity in the resist layer is fulfilled. The same features as described in any of the previous examples may be present resulting in the same advantages.

The results of the optimization according to any of the previous examples may be used in a method for lithographic processing of a substrate. The method of lithographic processing of a substrate then comprises using BARC layer parameters or other process parameters optimized according to any of the methods as described above.

In a further example, a processing system is described in which the method examples are implemented. In other words, a processing system adapted for performing any of the setting up methods for lithographic processing is described. For example, a setting up method for lithographic processing of a substrate with a resist layer, includes selecting values for a set of process parameters, determining the substrate reflectivity in the resist layer for the lithographic processing characterized by the set of selected process parameter values, and evaluating whether the determined substrate reflectivity is smaller than a maximum allowable substrate reflectivity. The maximum allowable substrate reflectivity is determined as a function of a normalized image log-slope for the lithographic processing.

Figure 3:
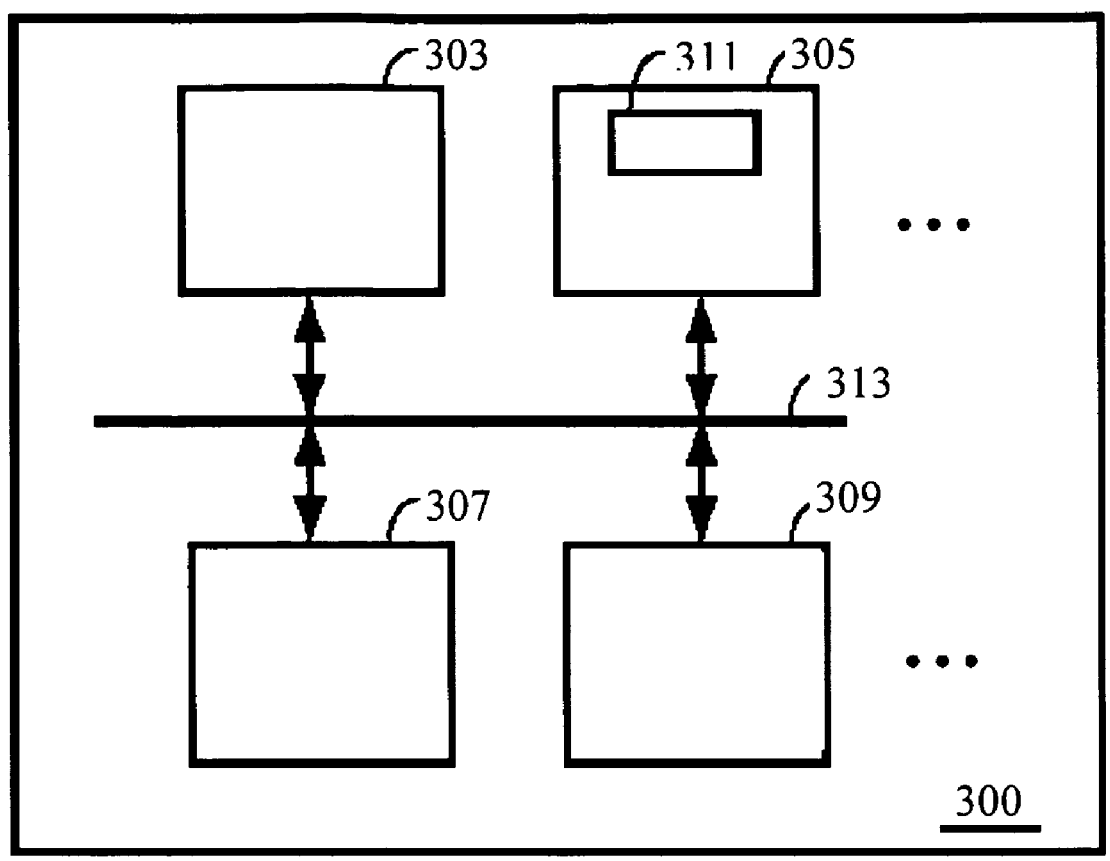
FIG. 3 is a schematic overview of a processing means that may be used for performing any of or part of the methods, according to an example.

An exemplary processing system 300 is shown in FIG. 3. FIG. 3 shows one configuration of processing system 300 that includes at least one programmable processor 303 coupled to a memory subsystem 305 that includes at least one form of memory, such as RAM, ROM, and so forth. A storage subsystem 307 may be included that has at least one disk drive and/or CD-ROM drive and/or DVD drive. In some implementations, a display system, a keyboard, and a pointing device may be included as part of a user interface subsystem 309 to provide for a user to manually input information. Ports for inputting and outputting data also may be included. More elements such as network connections, interfaces to various devices, and so forth, may be included, but are not illustrated in FIG. 3.

The various elements of the processing system 300 may be coupled in various ways, including via a bus subsystem 313 shown in FIG. 3. For simplicity, the bus subsystem 313 is shown as a single bus, but will be understood to those in the art to include a system of at least one bus. The memory of the memory subsystem 305 may at some time hold part or all (in either case shown as 311) of a set of instructions that when executed on the processing system 300 implement the step(s) of the method embodiments described herein.

It is to be noted that the processor 303 or processors may be a general purpose or a special purpose processor, and may be embedded in a device (e.g., a chip) that has other components that perform other functions. Thus, one or more aspects of the lithographic processing can be implemented in digital electronic circuitry, or in computer hardware, firmware, software, or in various combinations. Furthermore, these aspects can be implemented in a computer program product tangibly embodied in a carrier medium carrying machine-readable code for execution by a programmable processor.

Method steps described herein may be performed by a programmable processor executing instructions to perform functions by operating on input data and generating output data. Accordingly, the present example system includes a computer program product which provides the functionality of any of the methods described herein when executed on a computing device. Further, the present invention includes a data carrier such as for example a CD-ROM or a diskette which stores the computer product in a machine-readable form and which executes at least one of the methods of the invention when executed on a computing device. Nowadays, such software is often offered on the Internet or a company Intranet for download, hence the computer product can be transmitted over a local or wide area network.

The advantages of the methods and systems are further illustrated by way of two series of examples, a first one showing the results of swing-experiments for printing lines and a second one showing the focus-exposure results for printed contacts. These examples are provided by way of illustration only and are non-limiting.

In a first series of examples, swing-experiments for printing lines are performed. For the swing-experiment, many exposures are carried out on the ASML XT: 1250Di immersion scanner with an NA of 0.85, and using a 6% attenuated phase shift mask (PSM). Various enhancement techniques are used to allow printing of small pitches, such as annular exposure ($\sigma$=0.93-0.69), C-quad ($\sigma$=0.96-0.76, $\alpha$=20°), and dipole illumination ($\sigma$=0.93-0.69, $\alpha$=40°).

During lithographic processing, illumination is performed for a substrate 114, covered by a BARC 120 and a resist layer 112. The thickness of the BARC 120 thereby is used as selectable process parameter. The substrate 114 used in the present example is a silicon wafer coated with an ARC29A BARC 120, as obtainable from Brewer Science & Nissan Chemicals. The resist layer used was PAR817, as obtainable from Sumitomo Chemicals Co.

In order to measure CD swing curves, various thicknesses for the resist layer in the range from 120 nm to 190 nm are used. 60 nm and 70 nm lines with a duty cycle from 1:1 to isolated lines are evaluated, using CD-Scanning Electron Microscopy (SEM), using the eCD1SEM from KLA-Tencor, and using scatterometry, the latter in order to enhance the measurement accuracy. First, from the obtained results it could be concluded that for a lot of L/S structures, (almost) no swing effects are observed, for none of the BARC layers, indicating that the substrate reflectivity in the resist does not always lead to swing-problems, and no difference is seen between the old and the new BARC thickness. Second, for some pitches, an obvious swing effect is present, whereby significantly less swing occurs for the BARC thickness determined by the advanced method, but whereby the importance of the substrate reflectivity in the resist layer does not typically increase for smaller pitches.

A few examples of critical dimension swing curves, being representative of the large amount of CD-swing curves measured, are presented below. In the examples, results are obtained both for an optimized BARC thickness determined in the conventional way (79 nm), further referred to as conventional optimized BARC thickness, whereby only normal incident light is taken into account, and for an optimized BARC thickness determined by the advanced way (87 nm), further referred to as advanced optimized BARC thickness, whereby the angles of incidence on the resist, substrate and BARC are taken into account.

Figure 4A:
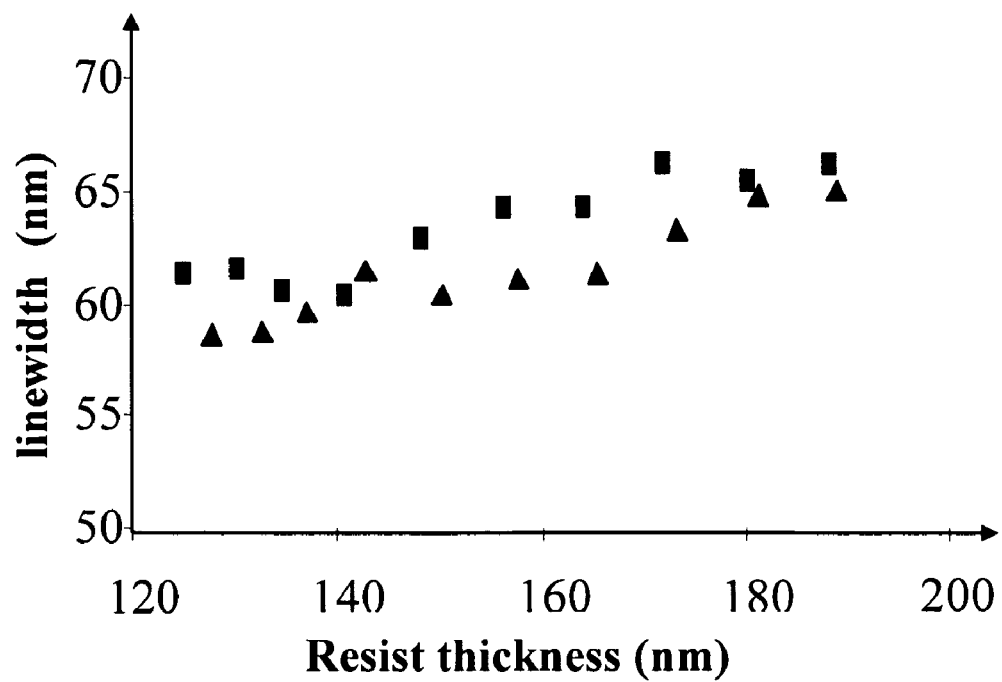
FIG. 4a and FIG. 4b are graphs of line width as a function of resist thickness indicating critical dimension swing for 60 nm lines with a 124 nm pitch (FIG. 4a) or a 122 nm pitch (FIG. 4b), for a conventional optimized BARC thickness (solid squares) and an advanced optimized BARC thickness (solid triangles)
Figure 4B:
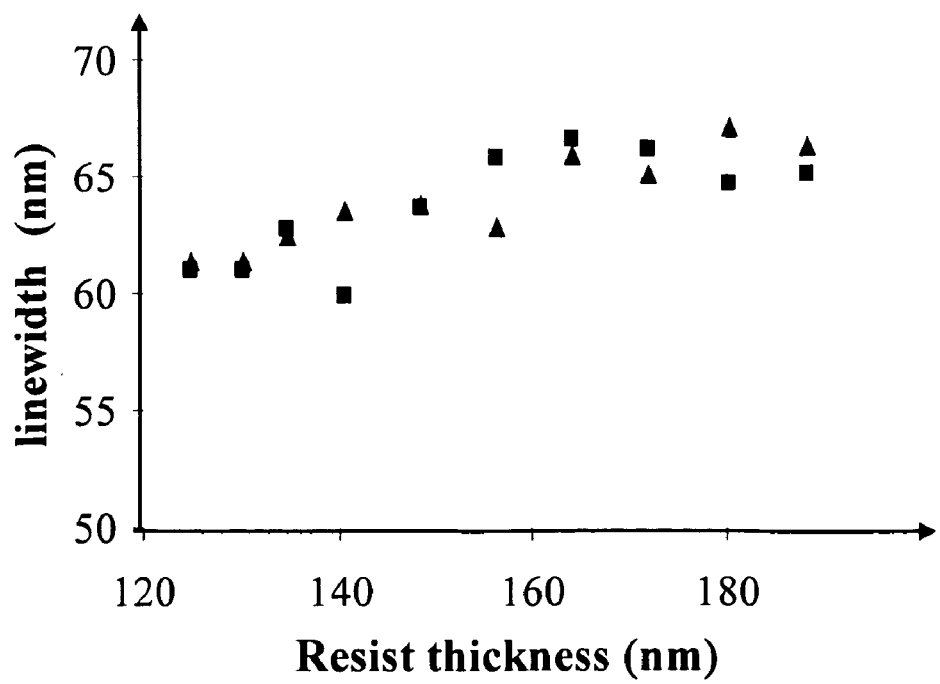

In a first example, swing curves are made for 60 nm lines with 124 nm and 122 nm pitch using dipole illumination. SEM measurements for evaluation of the critical dimension show no swing for none of the BARC thicknesses, as can be seen in FIG. 4a and FIG. 4b, for the 124 nm pitch and the 122 nm pitch respectively. Results for the conventional optimized BARC thickness are shown by squares, results for the advanced optimized BARC thickness are shown by triangles. No CD-swing occurs, leading to the conclusion that these small pitches are rather insensitive to variations in substrate reflectivity. The latter illustrates that in some cases the quality of the print is not strongly influenced by substrate reflectivity (i.e., away from a fixed level for maximum allowable substrate reflectivity).

Figure 5A:
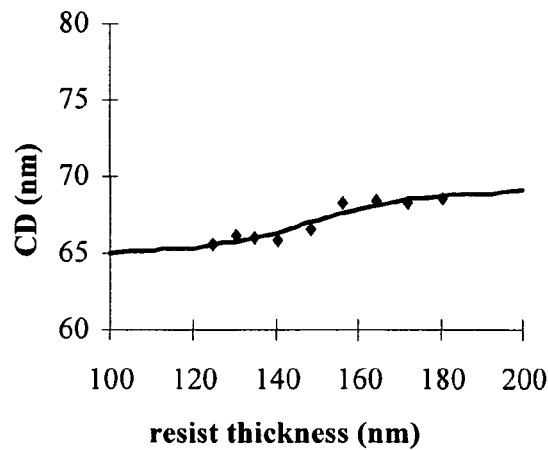
FIG. 5a to FIG. 5d are graphs of line width as a function of resist thickness indicating critical dimension swing for 70 nm lines with a 140 nm pitch (FIG. 5a and FIG. 5b) or a 420 nm pitch (FIG. 5c and FIG. 5d), for a conventional optimized BARC thickness (FIGS. 5a, 5c) and an advanced optimized BARC thickness (FIGS. 5b, 5d)
Figure 5B:
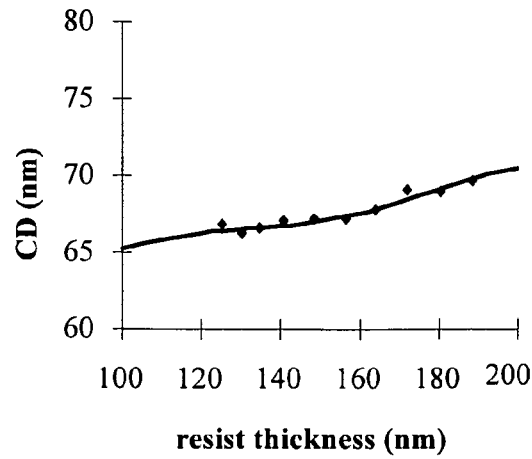
Figure 5C:
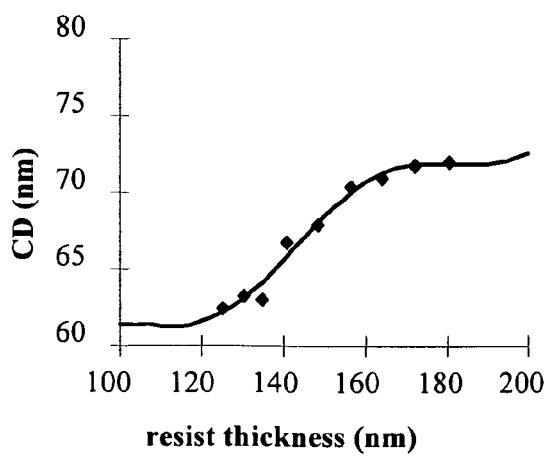
Figure 5D:
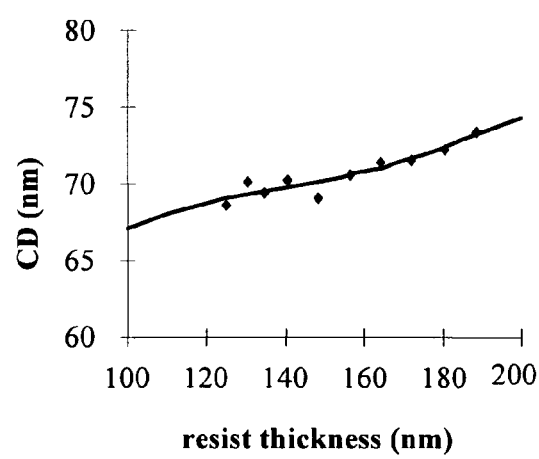

In a second example, swing curves are made for 70 nm lines with a 140 nm and a 420 nm pitch, both using dipole illumination. The 70 nm lines are measured using scatterometry. The results are plotted in FIG. 5a and FIG. 5b, indicating the results for a 140 nm pitch for the conventional optimized BARC thickness and advanced optimized BARC thickness respectively, and in FIG. 5c and FIG. 5d, indicating the results for a 420 nm pitch for the conventional optimized BARC thickness and the advanced optimized BARC thickness respectively.

For the 140 nm pitch case, almost no swing can be seen for both BARC thicknesses, indicating that in this case the sensitivity to substrate reflection is not very large. For a pitch of 420 nm, a clear difference is seen between both BARC thicknesses: the BARC thickness determined by the conventional method results in an obvious swing effect, whereas the BARC thickness determined by the advanced method results in superior CD control.

It is to be noted that the sensitivity to the substrate reflectivity is small for the 140 nm pitch, whereas it is large in the 420 nm pitch case. The latter is in agreement with the methods and systems described herein, as the 70 nm lines pattern with a 420 nm pitch using dipole exposures results in a remarkably lower NILS compared to the other structures. This indicates that not only the substrate reflectivity itself plays a role, but that also the NILS or NILS related parameter plays an important role.

Figure 6A:
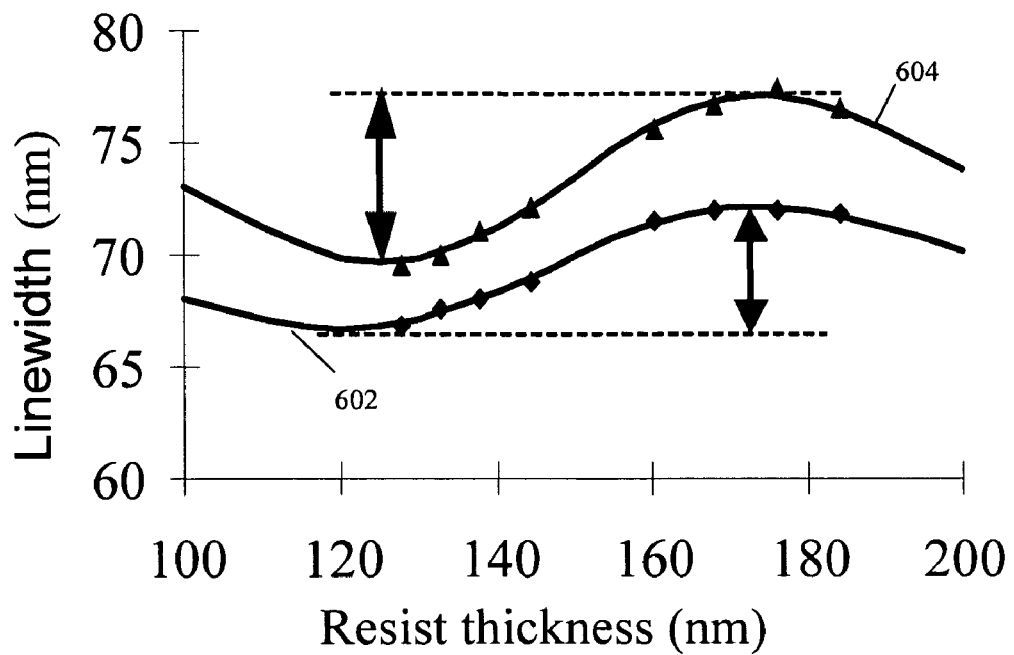
FIG. 6a and FIG. 6b are graphs of line width as a function of resist thickness indicating the critical dimension swing for 70 nm lines in best focus and 0.2 µm defocus for a conventional optimized BARC thickness (FIG. 6a) and an advanced optimized BARC thickness (FIG. 6b)
Figure 6B:
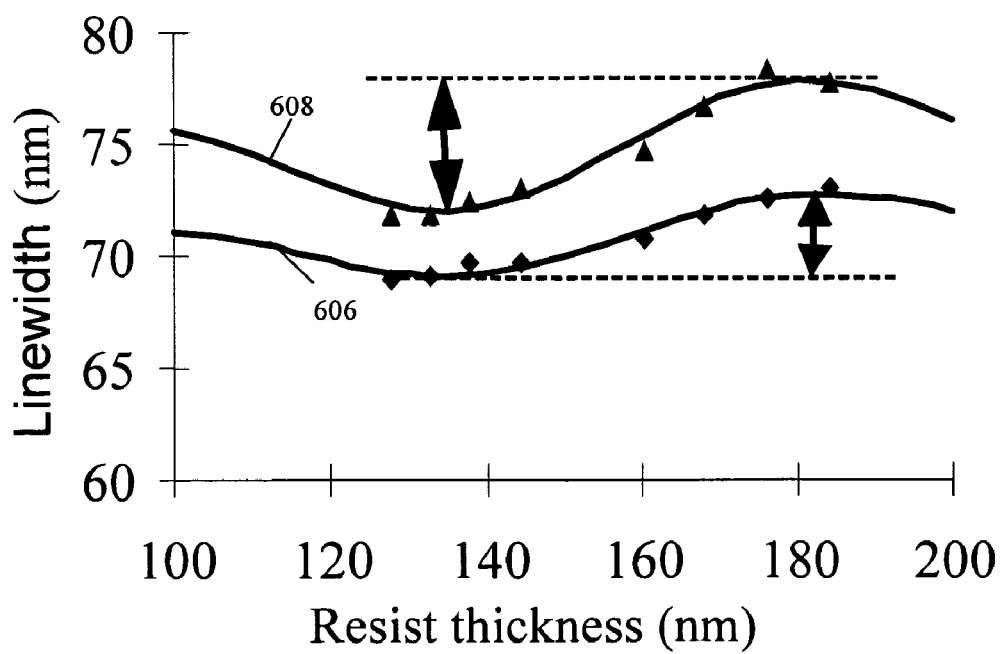

In a third example, swing curves are made for 70 nm lines using annular illumination, as shown in FIG. 6a and FIG. 6b for a conventional optimized BARC thickness and an advanced optimized BARC thickness respectively. Scatterometry is used to enhance the accuracy of the CD measurements, and measurements are performed in best focus and at 0.2 μm defocus.

As expected, the swing effects are more pronounced in defocus, which is related to a decrease NILS (and hence exposure latitude) with defocus. Furthermore, even in best focus, a clear swing effect is seen, especially if the BARC thickness optimized according to the conventional method is used. The results for the best focus are indicated by curves 602 and 606, while the results for defocus are indicated by curves 604 and 608.

The new BARC thickness performs clearly better, although still some swing is present. The latter again is an illustration of the important role played by the NILS or NILS related parameter as both for 70 nm dense lines patterned with annular illumination as well as for patterns made in defocus, the NILS is remarkably lower than for other patterns or compared to the best focus case. This way, the need for a floating criterion (i.e., away from the absolute value for maximum allowable substrate reflectivity) is supported and illustrated by the above experiment.

In a second series of examples, quality of contact development in defocus are studied. The experiments allow determining the sensitivity of the process windows of small contacts to substrate reflectivity. The absorbed energy in the resist will suffer from standing waves if significant substrate reflections are present, resulting in a slower development of the resist. Hence contacts might be not open after the standard development time, due to the standing waves. This effect is more pronounced in defocus, hence the focus-exposure window of contacts will be smaller in case of substrate reflectivity problems.

For this test, 80 nm contacts are patterned with pitches from 160 nm to isolated holes. A 200 nm AJ2211 resist, which is available from Sumitomo Chemicals Co., is coated on top of an ARC29A BARC, and is covered with TCX007 topcoat, which is available from J.S.R. Corporation. Exposures are carried out on the ASML XT:1250i immersion scanner, using an NA of 0.85 and Quasar illumination ($\sigma$=0.93-0.57), in combination with a 6% attenuated PSM. A 77 nm BARC thickness, corresponding with the conventional method of determining substrate reflectivity, and an 85 nm BARC thickness, corresponding with the advanced method of determining substrate reflectivity, are used. The latter is a compromise between the optimum thicknesses of the various pitches on the mask.

Figure 7:
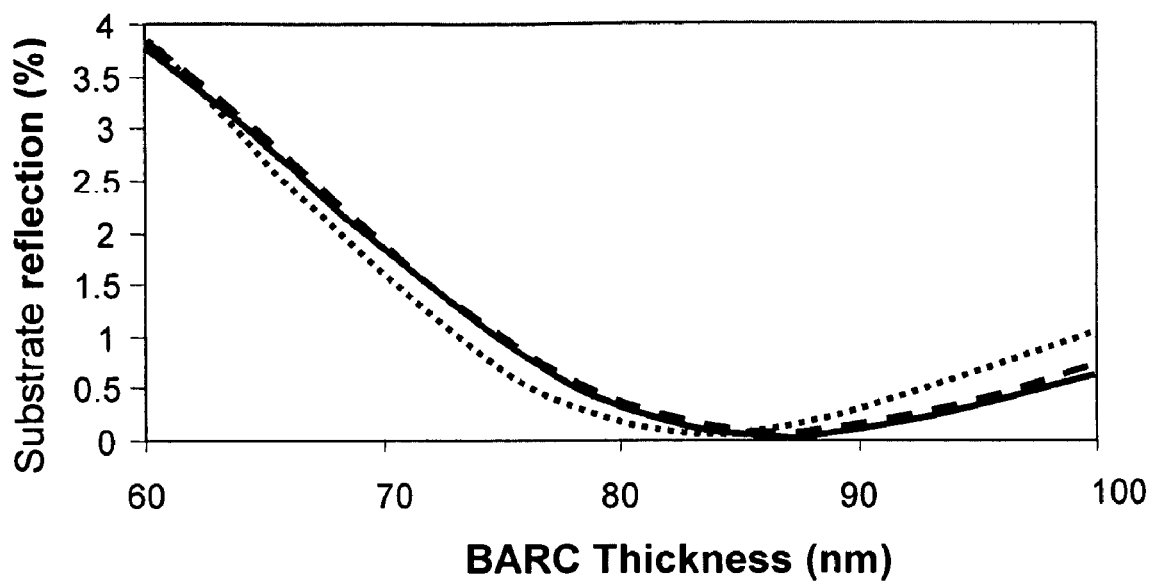
FIG. 7 is a graph that illustrates reflected light intensity in the resist as a function of the BARC thickness determined for different pitches (short dash: 270 nm; solid: 180 nm; long dash: 160 nm) using the angles of incidence.
Figure 8A:
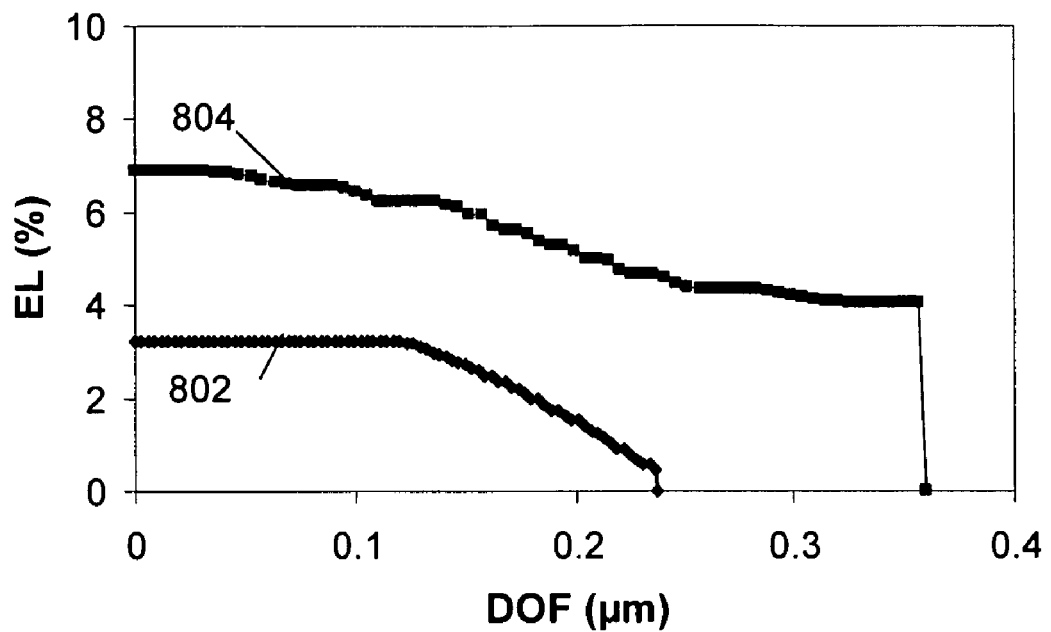
FIG. 8a to FIG. 8d are focus-exposure plots for 80 nm contact holes for 160 nm pitch (FIG. 8a), 180 nm pitch (FIG. 8b), 270 nm pitch (FIG. 8c), and 800 nm pitch (FIG. 8d), for a conventional optimized BARC thickness (lower curve) and an advanced optimized BARC thickness (upper curve)
Figure 8B:
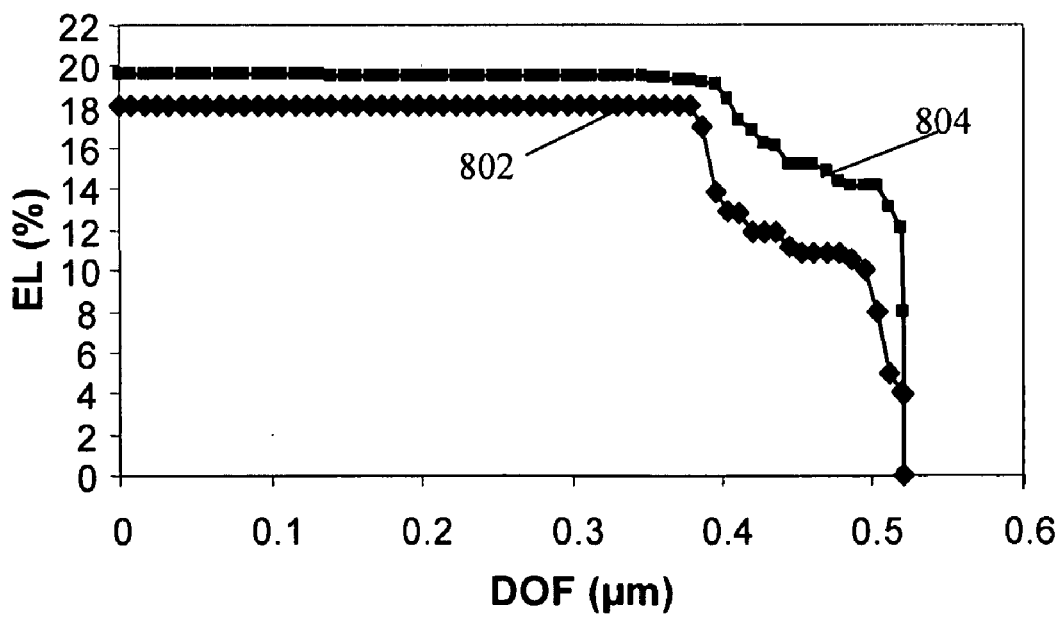
Figure 8C:
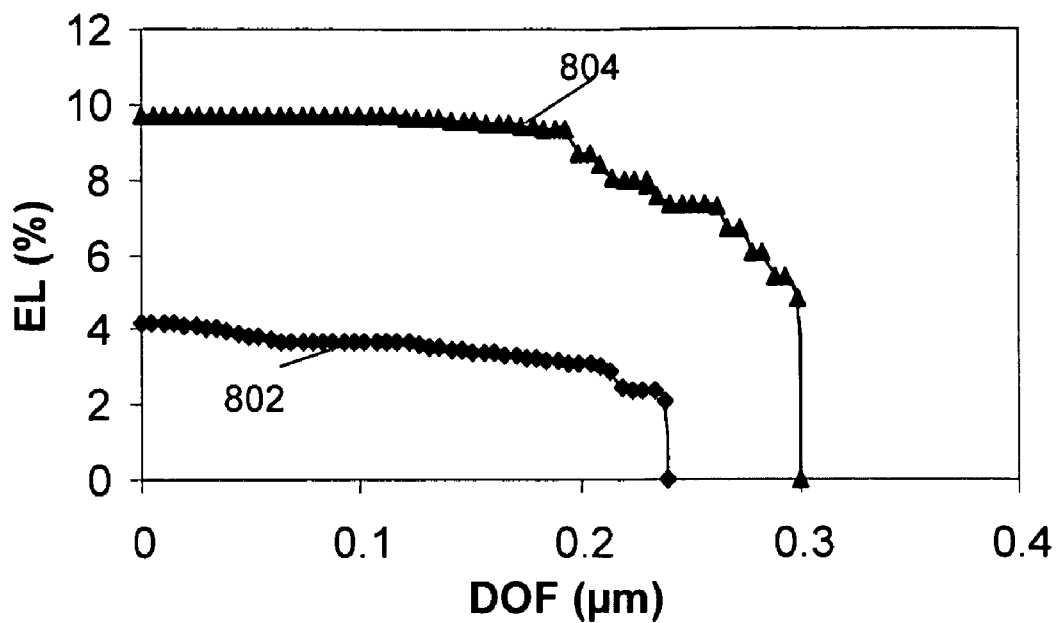
Figure 8D:
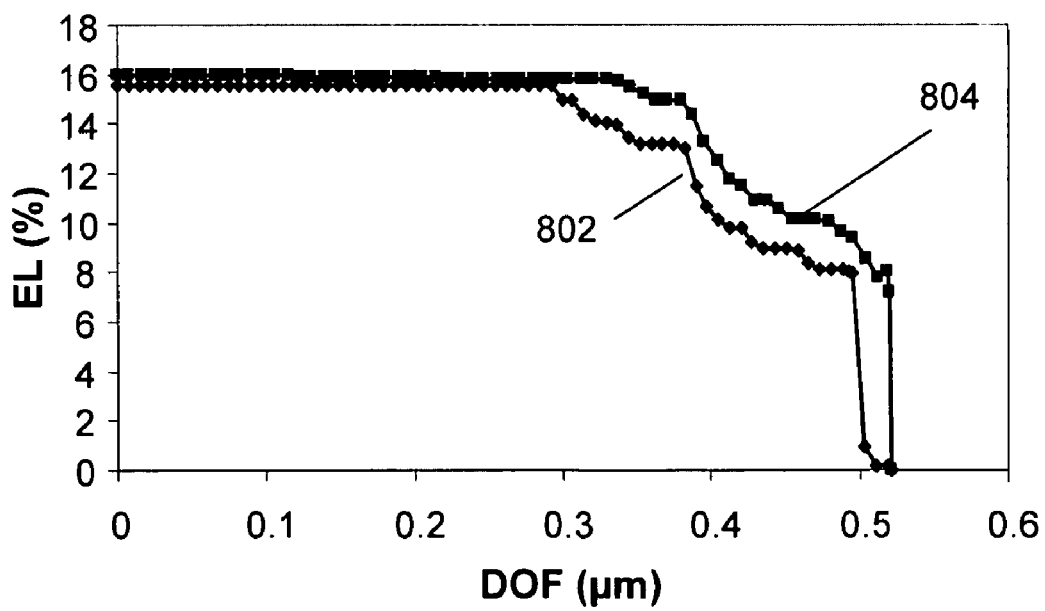

This is illustrated in FIG. 7, showing the substrate reflection as function of BARC thickness for the three structures on the mask. There is almost no difference in reflection for a 160 nm (dashed line) and 180 nm (full line) pitch, which is as expected as due to the off-axis illumination condition, the center of the lens is not used, and the difference in angles of incidence of the light rays (related to the lens pupil pattern) is rather small. A 87 nm optimum BARC thickness results. For larger pitches, the angles of incidence are smaller, and the optimum BARC thickness for a 270 nm pitch (dotted line) is 84 nm. Considering also all other pitches on the mask, a BARC thickness of 85 nm is a good compromise.

In Table 1, the obtained substrate reflection is shown for various pitches using 77 nm BARC indicated by curve 802 and 85 nm BARC indicated by curve 804. The reflection decreased by a factor 10 using the advanced BARC optimization method, indicating the advantages of the second method example.

TABLE 1

Substrate reflection for 80 nm contacts with various pitches

| Pitch (nm) | Substrate reflection (%) 77 nm BARC | Substrate reflection (%) 85 nm BARC |
|---|---|---|
| 160 | 0.64 | 0.056 |
| 180 | 0.64 | 0.061 |
| 270 | 0.38 | 0.032 |

A number of results will now be discussed in more detail. Critical dimension measurements are performed on a focus-exposure matrix for 80 nm contacts with pitches from 160 nm to 800 nm and the Exposure Latitude (EL) versus depth of focus (DOF) is determined. The results are plotted in FIG. 8a, FIG. 8b, FIG. 8c and FIG. 8d, indicating the focus-exposure plots for 80 nm contact holes for a 160 nm pitch, a 180 nm pitch, a 270 nm pitch, and a 800 nm pitch respectively.

It can be seen that for 160 nm pitch and 270 nm pitch, the BARC thickness determined by the advanced method, results in a larger process window, indicating advantages of the second method example. For 800 nm pitch, the difference between both BARC thicknesses is very small, due to the reduced angle of incidence of the light rays for the relatively large pitch. For the 180 nm pitch, although relatively large angles of incidence are involved (i.e., between 25° and 36°) the difference in process window for different BARC thicknesses and consequently for different reflectivities in the resist, is small. These results cannot be explained by SEM inaccuracy and simulations confirm that the reflectivity for 160 nm, 180 nm, and 270 nm pitch are similar, as also shown in

TABLE 2

Substrate reflection and NILS for 80 nm contacts with various pitches

| Pitch (nm) | Substrate refl (%) 77 nm BARC | Substrate refl (%) 85 nm BARC | NILS |
|---|---|---|---|
| 160 | 0.64 | 0.056 | 0.7 |
| 180 | 0.64 | 0.061 | 1.6 |
| 270 | 0.38 | 0.032 | 1.1 |

Nevertheless, for a pitch of 160 nm corresponding with a high sensitivity to reflections, the NILS value is low. For 270 nm pitch, corresponding with a high sensitivity to reflections, the NILS is rather low too, since this a difficult pitch to pattern for these NA and Quasar settings ('forbidden pitch'). For 180 nm pitch, the NILS is high (almost ideal quasar settings). Hence reflections can be up to 0.6% without decreasing the process window, while for 160 nm and 270 nm pitch the reflection has to be much lower (0.03 to 0.06%) in order to have sufficient process margin. The latter indicates that the allowable substrate reflectivity is not a fixed limit, but that it depends on structure and hence on the NILS value. In other words, the conventional criterion of 0.5% for maximum substrate reflection is clearly not valid anymore.

Figure 9A:
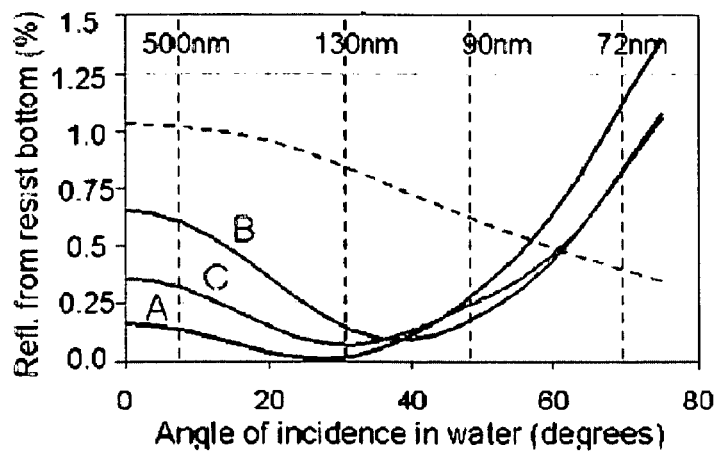
FIG. 9a to FIG. 9c illustrate graphs of obtained substrate reflectivity as a function of the angle of incidence in water for different lithographic settings for a dual BARC stack (unpolarized source in FIG. 9a, Y-polarized source in FIG. 9b, X-polarized source in FIG. 9c).
Figure 9B:
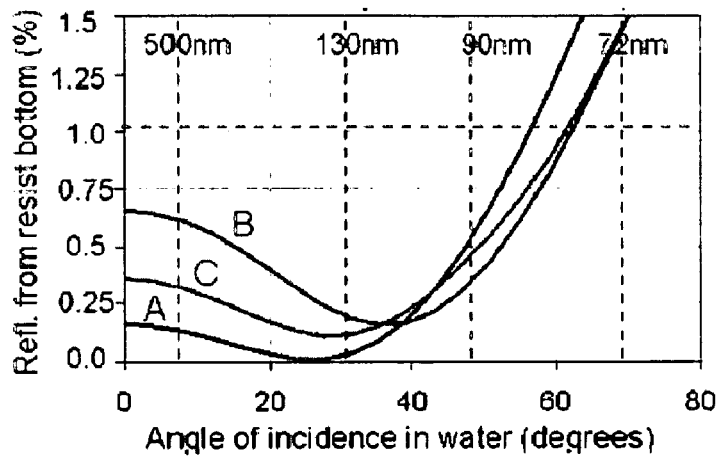
Figure 9C:
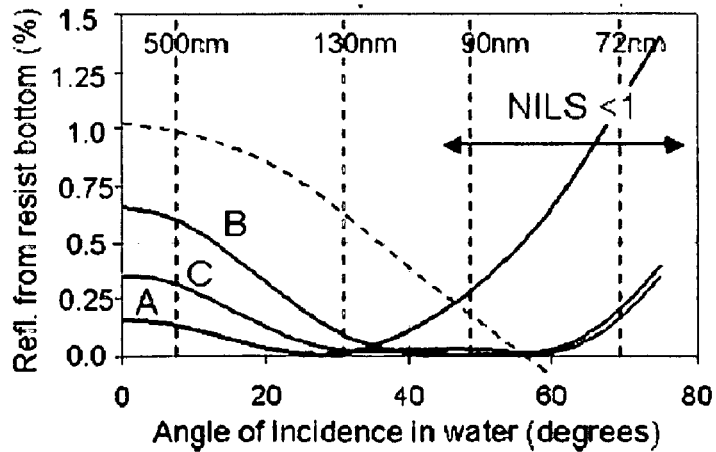

FIGS. 9a to FIG. 9c show that the floating criterion varies as function of the pitch for different sets of lithographic parameters. Results are shown for the obtained substrate reflectivity as a function of the angle of incidence of the light. As in the present example, an alternating phase shift mask is used with zero sigma, each pitch corresponds with an angle of incidence, thus FIG. 9a to FIG. 9c illustrate the obtained substrate reflectivity as a function of the pitch.

Results are shown for lithographic processing using a dual BARC stack, wherein the bottom BARC closest to the substrate is a BARC with a real refractive index $n_{bottom}=1.55$ and an extinction coefficient $k_{bottom}=0.5$ and wherein the top BARC closest to the resist layer is a BARC with a real refractive index $n_{top}=1.65$ and an extinction coefficient $k_{top}=0.25$. Curve A corresponds with a 70 nm bottom BARC and a 35 nm top BARC, curve B corresponds with a 70 nm bottom BARC and a 42 nm top BARC and curve C corresponds with at 62 nm bottom BARC and a 42 nm top BARC. Results are shown for three different types of polarization: results for an unpolarized light source are shown in FIG. 9a, results for a Y-polarized light source are shown in FIG. 9b and results for an X-polarized light source are shown in FIG. 9c. It can be seen that for different sets of lithographic parameters, the floating criterion varies as a function of the pitch.

The above examples illustrate the importance of realizing that the amount of substrate reflectivity depends on the value of the NILS parameter or a parameter corresponding therewith, as described by the methods and systems described herein.

Other arrangements for accomplishing the objectives of the methods and systems embodying the invention will be obvious for those skilled in the art. It is to be understood that although preferred embodiments, specific constructions and configurations, as well as materials, have been discussed herein for devices according to the present invention, various changes or modifications in form and detail may be made without departing from the scope and spirit of this invention.

I claim:

1. A method for setting up lithographic processing of a substrate with a resist layer, the lithographic processing being characterized by a set of selectable process parameter values, comprising:
    selecting values for a set of process parameters,
    determining a substrate reflectivity in the resist layer for the lithographic processing characterized by the set of selected process parameter values; and
    evaluating whether the determined substrate reflectivity is smaller than a maximum allowable substrate reflectivity, wherein the maximum allowable substrate reflectivity is determined as a function of a normalized image log-slope for the lithographic processing;
    wherein the method further comprises:
        identifying different structures to be processed and determining a corresponding normalized image log-slope for each identified different structure to be processed;
        determining the maximum allowable substrate reflectivity for each corresponding normalized image log-slope value;
        selecting at least one structure corresponding with a lowest value for a ratio of normalized image log-slope/maximum allowable substrate reflectivity; and
        performing the selecting values of the process parameters, the determining the substrate reflectivity, and the evaluating for optimizing lithographic processing of the at least one selected structure.

2. The method of claim 1, wherein the lithographic processing includes using at least one bottom anti-reflective layer for reducing substrate reflectivity for incident light rays, the at least one bottom anti-reflective layer being characterized by a set of selectable optical parameter values, wherein selecting a set of process parameter values comprises selecting a set of optical parameter values for the at least one bottom anti-reflective layer.

3. The method of claim 1, wherein setting up the lithographic processing includes selecting substrate material properties.

4. The method of claim 1, wherein the maximum allowable substrate reflectivity is smaller than 0.5%.

5. The method of claim 1, wherein the maximum allowable substrate reflectivity is smaller than 0.3%.

6. The method of claim 1, wherein the maximum allowable substrate reflectivity is smaller than 0.1%.

7. The method of claim 1, wherein the substrate reflectivity is determined by taking into account an angle of incidence of incident light rays on the substrate.

8. The method of claim 2, wherein the substrate reflectivity is determined by taking into account an angle of incidence of incident light rays on the at least one bottom anti-reflective layer.

9. A method according to claim 1, wherein the set of process parameters is selected from the group of parameters consisting of applied numerical aperture, coherency factor, mask type, mask pattern, mask pitch, real refractive index, extinction coefficient, thickness of an immersion fluid, thickness of a coating on top of a resist layer, thickness of a resist layer, and substrate material properties.

10. A method for selecting at least one bottom anti-reflective coating for lithographic processing of a device, comprising:
  selecting values for optical parameters characterizing the at least one bottom anti-reflective coating so as to obtain a substrate reflectivity smaller than a maximum allowable substrate reflectivity, wherein the maximum allowable substrate reflectivity is determined as a function of a normalized image log-slope for the lithographic processing;
  wherein the method further comprises:
    identifying different structures to be processed and determining a corresponding normalized image log-slope for each identified different structure to be processed;
    determining the maximum allowable substrate reflectivity for each corresponding normalized image log-slope values;
    selecting at least one structure corresponding with a lowest value for a ratio of normalized image log-slope/maximum allowable substrate reflectivity; and
    performing the selecting values of the process parameters, the determining the substrate reflectivity, and the evaluating for optimizing lithographic processing of the at least one selected structure.

11. A method for lithographic processing of a device, comprising:
  using at least one bottom anti-reflective coating selected so as to obtain a substrate reflectivity smaller than a maximum allowable substrate reflectivity, wherein the maximum allowable substrate reflectivity is determined as a function of a normalized image log-slope for the lithographic processing;
  wherein the method further comprises:
    identifying different structures to be processed and determining a corresponding normalized image log-slope for each identified different structure to be processed;
    determining the maximum allowable substrate reflectivity for each corresponding normalized image log-slope value;
    selecting at least one structure corresponding with a lowest value for a ratio of normalized image log-slope/maximum allowable substrate reflectivity; and
    performing the selecting values of the process parameters, the determining the substrate reflectivity, and the evaluating for optimizing lithographic processing of the at least one selected structure.

* * * * *

UNITED STATES PATENT AND TRADEMARK OFFICE
CERTIFICATE OF CORRECTION

PATENT NO. : 7,824,827 B2
APPLICATION NO. : 11/224367
DATED : November 2, 2010
INVENTOR(S) : Op de Beeck Page 1 of 1

It is certified that error appears in the above-identified patent and that said Letters Patent is hereby corrected as shown below:

Title page should list IMEC as the assignee, by reading:

(73) IMEC, Leuven (BE)

Signed and Sealed this
Twenty-sixth Day of July, 2011

David J. Kappos
*Director of the United States Patent and Trademark Office*